United States Patent
Yano et al.

(10) Patent No.: US 12,144,130 B2
(45) Date of Patent: Nov. 12, 2024

(54) VENTILATION COMPONENT

(71) Applicant: NITTO DENKO CORPORATION, Ibaraki (JP)

(72) Inventors: Youzou Yano, Osaka (JP); Tomoyuki Kasagi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 406 days.

(21) Appl. No.: 17/774,341

(22) PCT Filed: Nov. 5, 2020

(86) PCT No.: PCT/JP2020/041376
§ 371 (c)(1),
(2) Date: May 4, 2022

(87) PCT Pub. No.: WO2021/090887
PCT Pub. Date: May 14, 2021

(65) Prior Publication Data
US 2022/0369481 A1 Nov. 17, 2022

(30) Foreign Application Priority Data
Nov. 7, 2019 (JP) .................................. 2019-202092

(51) Int. Cl.
*H05K 5/02* (2006.01)
*B01D 53/22* (2006.01)
(Continued)

(52) U.S. Cl.
CPC ........... *H05K 5/0213* (2013.01); *B01D 53/22* (2013.01); *B01D 69/10* (2013.01); *F16B 19/008* (2013.01); *F16J 15/104* (2013.01); *B60R 16/02* (2013.01)

(58) Field of Classification Search
CPC combination set(s) only.
See application file for complete search history.

(56) References Cited

U.S. PATENT DOCUMENTS 6,364,924 B1 * 4/2002 Mashiko ............... F21S 45/33
  96/13
6,994,621 B2 * 2/2006 Mashiko ............... H02K 5/10
  362/345
(Continued)

FOREIGN PATENT DOCUMENTS

JP 2001143524 5/2001
JP 2004047425 2/2004
(Continued)

OTHER PUBLICATIONS

Office Action issued for Indian Patent Application No. 202217031019, Date of Dispatch: Sep. 23, 2022, 6 pages.
(Continued)

*Primary Examiner* — Christopher P Jones
*Assistant Examiner* — Sonji Turner
(74) *Attorney, Agent, or Firm* — HSML P.C.

(57) ABSTRACT

A ventilation component 1 includes a ventilation path 10 for allowing ventilation between an inner space 2u and an outer space 2s of a housing 2. The ventilation path 10 is a path for allowing ventilation between the internal space 2u and the outer space 2s when the ventilation component 1 is attached to an edge 2f. The ventilation component 1 includes a supporting portion 12, a gas-permeable membrane 11, a protruding portion 13, and a sealing member 14. The supporting portion 12 surrounds the ventilation path 10. The gas-permeable membrane 11 is bonded to the supporting portion 12 and closes the ventilation path 10 in a ventilatable manner. The protruding portion 13 is a part having a tubular shape, the part being arranged to protrude from the supporting portion 12 and surround one end of the ventilation path 10, the part being configured to be in contact with the edge 2f when the ventilation component 1 is attached to the edge (Continued)

2f. The ventilation component 1 satisfies requirements $2.5 \leq Gs/Gt \leq 5.0$ and $1.0 \leq \{(Gs-Gt)/2\}/Lt \leq 3.0$.

4 Claims, 5 Drawing Sheets

(51) Int. Cl.
    *B01D 69/10*     (2006.01)
    *B60R 16/02*     (2006.01)
    *F16B 19/00*     (2006.01)
    *F16J 15/10*     (2006.01)

(56) References Cited

U.S. PATENT DOCUMENTS

| | | | | |
|---|---|---|---|---|
| 7,626,129 | B2* | 12/2009 | Sasaki | H05K 5/0216 |
| | | | | 174/17 VA |
| 8,511,631 | B2* | 8/2013 | Kato | F16B 21/086 |
| | | | | 24/297 |
| 8,821,226 | B2* | 9/2014 | Yano | H05K 5/0216 |
| | | | | 454/162 |
| 10,253,794 | B2* | 4/2019 | Serrada Iranzo | F16B 5/0628 |
| 2003/0220067 | A1 | 11/2003 | Mashiko et al. | |
| 2009/0047890 | A1 | 2/2009 | Yano et al. | |
| 2010/0227543 | A1* | 9/2010 | Furuyama | B29C 66/1224 |
| | | | | 454/270 |
| 2010/0227544 | A1* | 9/2010 | Furuyama | F21V 31/03 |
| | | | | 454/339 |
| 2013/0012117 | A1* | 1/2013 | Uemura | B29C 66/5412 |
| | | | | 454/275 |
| 2020/0088440 | A1* | 3/2020 | Yano | F24F 11/89 |

FOREIGN PATENT DOCUMENTS

| | | | | |
|---|---|---|---|---|
| JP | 2007087666 A | * | 4/2007 | H05K 5/0213 |
| JP | 2007141629 | | 6/2007 | |
| JP | 2018182030 A | | 11/2018 | |
| WO | 2018199192 | | 11/2018 | |

OTHER PUBLICATIONS

International Search Report and Written Opinion issued for International Patent Application No. PCT/JP2020/041376, Date of mailing: Jan. 26, 2021, 11 pages including English translation.

* cited by examiner

VENTILATION COMPONENT

TECHNICAL FIELD

The present invention relates to a ventilation component.

BACKGROUND ART

Ventilation components configured to be attached to an edge of an opening of a housing have been known. Ventilation components can be used, for example, in devices such as vehicle lamps, inverters, converters, electronic control units (ECUs), battery packs, millimeter-wave radars, and vehicle-mounted cameras to eliminate a pressure difference occurring between the inside and the outside of the devices due to a temperature variation. These devices are sometimes required to prevent substances such as foreign matters, water, oil, and salt from entering the devices. In response to such a request, ventilation components are attached to housings of the devices.

Patent Literature 1 describes a vehicle lamp including a gas-permeable cap. In this gas-permeable cap, a substantially tubular body is fitted in a tubular cover component having a bottom. Additionally, a ventilation path is arranged between the inner circumference of the tubular cover component having a bottom and the outer circumference of the substantially tubular body and between a bottom face of the tubular cover component having a bottom and a bottom portion of the substantially tubular body. A mounting portion configured to be attached to a mounting opening of a housing is arranged at a top of the substantially tubular body.

Patent Literature 2 describes a ventilation member including a gas-permeable membrane through which gas passing an opening portion of a housing permeates in a state where the ventilation member is fixed to the opening portion. The ventilation member further includes a support including a supporting portion supporting the gas-permeable membrane and an insertion portion configured to be inserted in the opening portion. The insertion portion is divided at least on the insertion starting side thereof into a plurality of parts arranged circumferentially.

Patent Literature 3 describes a ventilation member configured to be attached to a housing requiring ventilation. The ventilation member includes a support, a gas-permeable membrane, and a cover component. The support includes a through hole serving as a ventilation path communicating the inside and the outside of the housing. The gas-permeable membrane is disposed on the support such that the gas-permeable membrane closes one opening of the through hole of the support. The cover component covers the support over the gas-permeable membrane. The support includes a plurality of leg portions. The support can be fixed to the housing by inserting the leg portions into the opening portion of the housing.

CITATION LIST

Patent Literature

Patent Literature 1: JP 2001-143524 A
Patent Literature 2: JP 2004-047425 A
Patent Literature 3: JP 2007-141629 A

SUMMARY OF INVENTION

Technical Problem

The techniques described in Patent Literatures 1 to 3 leave room for reexamination in terms of preventing breakage of the ventilation components at the time of inserting the ventilation components at a slant angle to an axis of an opening of a housing.

Therefore, the present invention provides a ventilation component that is advantageous in preventing breakage of the ventilation component at the time of inserting the ventilation component at a slant angle to an axis of an opening of a housing.

Solution to Problem

The present invention provides a ventilation component configured to be attached to an edge of an opening of a housing, the opening communicating an inner space and an outer space of the housing, the ventilation component comprising:

a ventilation path for allowing ventilation between the inner space and the outer space when the ventilation component is attached to the edge;

a supporting portion surrounding the ventilation path;

a gas-permeable membrane bonded to the supporting portion and closing the ventilation path in a ventilatable manner;

a protruding portion having a tubular shape, the protruding portion being arranged to protrude from the supporting portion and surround one end of the ventilation path, the protruding portion being configured to be in contact with the edge when the ventilation component is attached to the edge; and a sealing member disposed around the protruding portion, the sealing member configured to seal a gap between an outer surface of the housing and the ventilation component when the ventilation component is attached to the edge, wherein the ventilation component satisfies requirements $2.5 \leq Gs/Gt \leq 5.0$ and $1.0 \leq \{(Gs-Gt)/2\}/Lt \leq 3.0$, where $Gt$ is a maximum outer diameter of the protruding portion in a boundary between the protruding portion and the supporting portion, $Gs$ is a maximum outer diameter of an outer surface of the supporting portion in contact with the protruding portion and is defined when the outer surface of the supporting portion is viewed in plan, and $Lt$ is a maximum length of the protruding portion in a direction parallel to a central axis of the protruding portion.

Advantageous Effects of Invention

The above ventilation component is advantageous in preventing breakage of the ventilation component at the time of inserting the ventilation component at a slant angle to an axis of the opening of the housing.

DESCRIPTION OF EMBODIMENTS

Hereinafter, embodiments of the present invention will be described with reference to the drawings. The following description describes examples of the present invention, and the present invention is not limited to the following embodiments.

Figure 1:
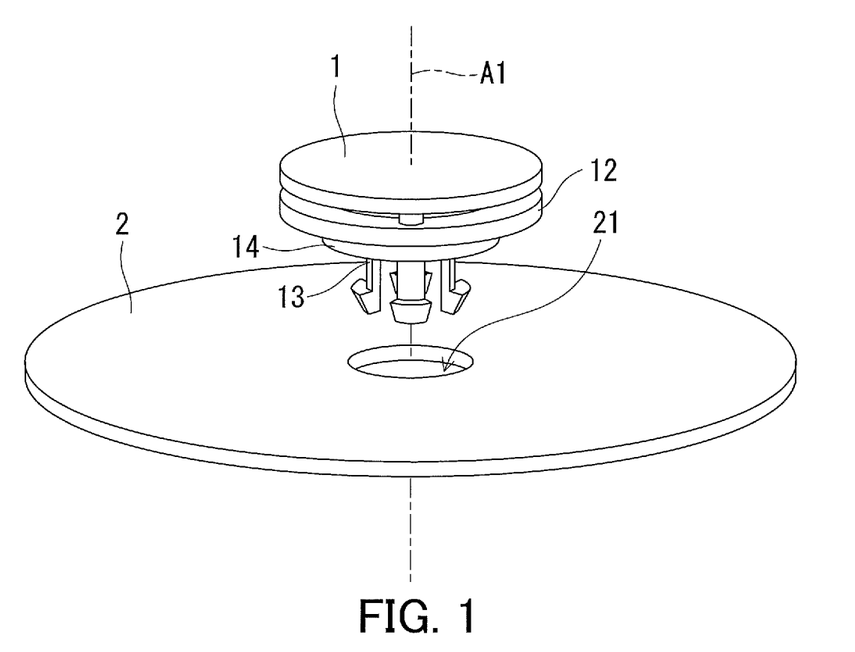
FIG. 1 is a perspective view showing a ventilation component according to the present invention.
Figure 2:
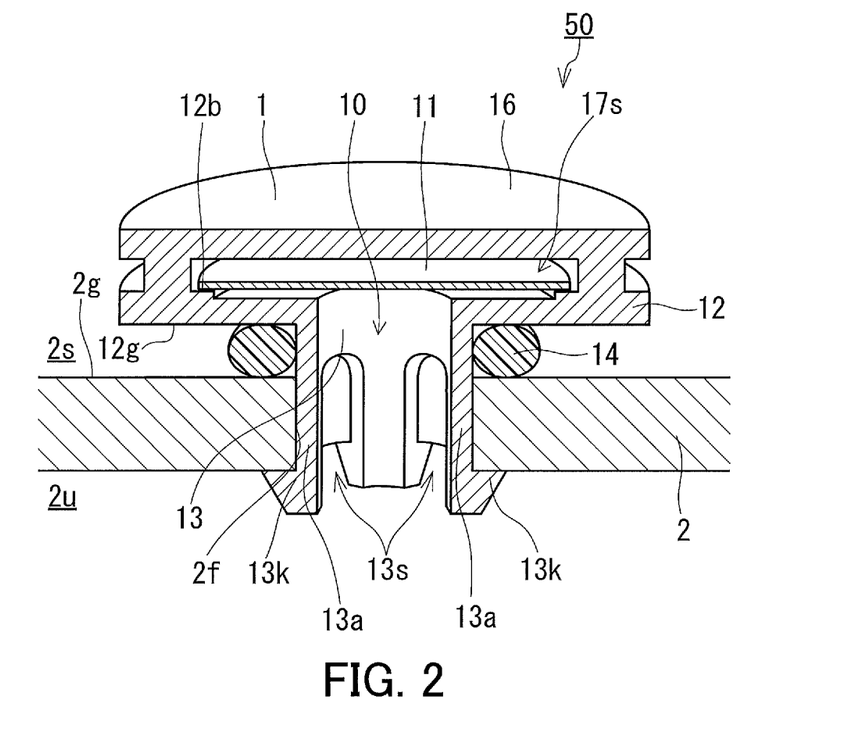
FIG. 2 is a cross-sectional perspective view showing one example of a ventilation structure provided using the ventilation component shown in FIG. 1.
Figure 3A:
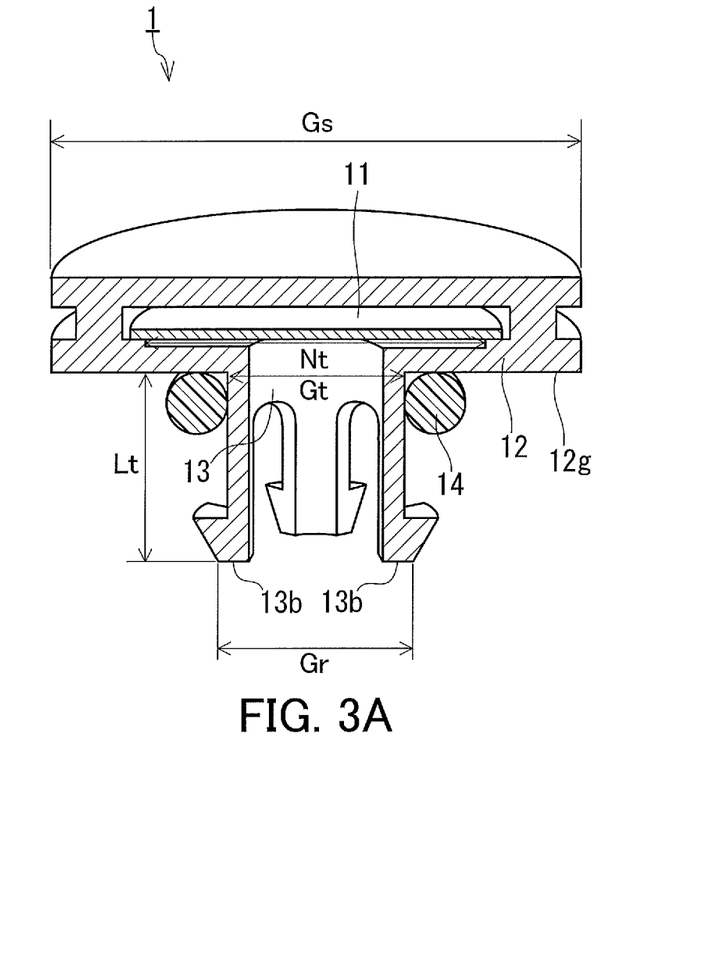
FIG. 3A is a cross-sectional perspective view showing dimensions of portions of the ventilation component shown in FIG. 1.

As shown in FIGS. 1 and 2, the ventilation component 1 is configured to be attached to an edge 2f of an opening 21 of a housing 2, the opening 21 communicating an internal space 2u and an outer space 2s of the housing 2. The ventilation component 1 includes a ventilation path 10. The ventilation path 10 is a path for allowing ventilation between the internal space 2u and the outer space 2s when the ventilation component 1 is attached to the edge 2f. The ventilation component 1 includes a supporting portion 12, a gas-permeable membrane 11, a protruding portion 13, and a sealing member 14. The supporting portion 12 surrounds the ventilation path 10. The gas-permeable membrane 11 is bonded to the supporting portion 12 and closes the ventilation path 10 in a ventilatable manner. The protruding portion 13 is a part having a tubular shape, the part being arranged to protrude from the supporting portion 12 and surround one end of the ventilation path 10, the part being configured to be in contact with the edge 2f when the ventilation component 1 is attached to the edge 2f. The sealing member 14 is disposed around the protruding portion 13, and seals a gap between an outer surface 2g of the housing 2 and the ventilation component 1 when the ventilation component 1 is attached to the edge 2f. The ventilation component 1 satisfies requirements $2.5 \leq Gs/Gt \leq 5.0$ and $1.0 \leq \{(Gs-Gt)/2\}/Lt \leq 3.0$. As shown in FIG. 3A, Gt is a maximum outer diameter of the protruding portion 13 in a boundary between the protruding portion 13 and the supporting portion 12. Gs is a maximum outer diameter of an outer surface 12g of the supporting portion 12 in contact with the protruding portion 13, the maximum outer diameter being defined when the outer surface 12g of the supporting portion 12 is viewed in plan from the protruding portion 13 side. Lt is a maximum length of the protruding portion 13 in a direction parallel to a central axis of the protruding portion 13.

As shown in FIG. 1, the protruding portion 13 is inserted into the opening 21 to attach the ventilation component 1 to the housing 2. When inserted, the protruding portion 13 comes in contact with the edge 2f of the opening 21 and is deformed inward. It is most desirable in view of preventing breakage of the protruding portion 13 that to attach the ventilation component 1 to the housing 2, the protruding portion 13 be inserted into the opening 21 such that the protruding portion 13 moves in parallel to an axis A1 of the opening 21. According to a study by the present inventors, however, it is sometimes difficult to move a ventilation component in parallel to an axis of an opening of a housing to insert the ventilation component into the opening of the housing. For example, because of design specifications of the housing 2, manual execution of attachment of a ventilation component to a housing, or other circumstances, it is sometimes difficult to move a ventilation component in parallel to an axis of an opening of a housing to insert the ventilation component into the opening of the housing. For example, it is sometimes difficult to automate attachment of a ventilation component to a housing of a particular device, and attachment thereto needs to be executed manually.

Therefore, the present inventors made intensive studies to discover a technique for preventing breakage of a ventilation component even in the case where the ventilation component is inserted into an opening at a slant angle to an axis of an opening of a housing. Through much trial and error, the present inventors have found that as described above, the ventilation component 1 satisfying the requirements $2.5 \leq Gs/Gt \leq 5.0$ and $1.0 \leq \{(Gs-Gt)/2\}/Lt \leq 3.0$ is advantageous in preventing breakage of the ventilation component 1 at the time of inserting the protruding portion 13 into the opening 21 with the ventilation component 1 at a slant angle to the axis A1.

Figure 4:
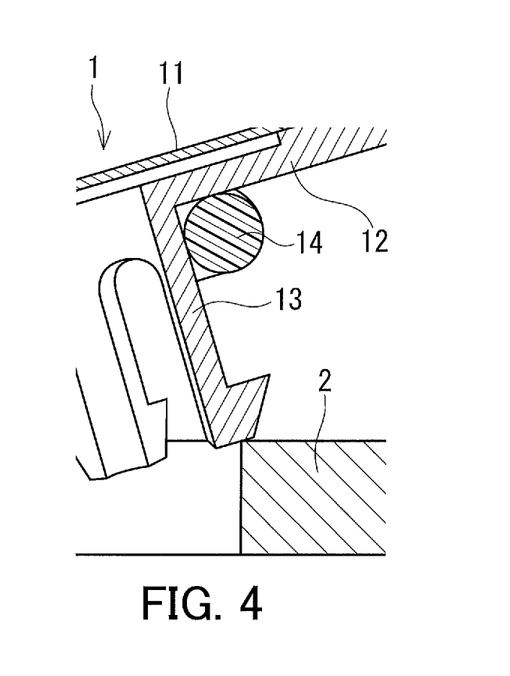
FIG. 4 is a cross-sectional view illustrating an advantage of the ventilation component.

As shown in FIG. 4, when the protruding portion 13 is inserted into the opening 21 with the ventilation component 1 at a slant angle to the axis A1, an end of the protruding portion 13 comes into contact with the edge 2f. The ventilation component 1 satisfying the requirements $2.5 \leq Gs/Gt$ and $1.0 \leq \{(Gs-Gt)/2\}/Lt$ is likely to make a small inclination angle with the axis A1 when the outer surface 12g of the supporting portion 12 is in contact with the outer surface 2g of the housing 2. Additionally, when the ventilation component 1 is pushed toward the internal space 2u of the housing 2 with the protruding portion 13 and the outer surface 2g of the housing 2 in contact with each other, a moment acting on a contact area of the protruding portion 13 with a fulcrum thereof at a root of the protruding portion 13 is likely to be small, the contact area being in contact with the outer surface 2g. Consequently, outward deformation of the protruding portion 13 is reduced and breakage of the ventilation component 1 is easily prevented.

Since the requirement $Gs/Gt \leq 5.0$ is satisfied, the distance between a peripheral edge of the outer surface 12g of the supporting portion 12 and the opening 21 is likely to be small, and the housing 2 to which the ventilation component 1 is to be attached is less strictly limited. Since the requirement $\{(Gs-Gt)/2\}/Lt \leq 3.0$ is satisfied, the maximum length Lt of the protruding portion 13 is likely to be short, a dimension of the sealing member 14 in the direction parallel to the central axis of the protruding portion 13 can be reduced, and the cost of manufacturing the ventilation component 1 can be reduced.

The ratio Gs/Gt is desirably 2.6 or more and more desirably 2.8 or more. The ratio Gs/Gt is desirably 4.5 or less and more desirably 4.0 or less.

The value of $\{(Gs-Gt)/2\}/Lt$ is desirably 1.2 or more and more desirably 1.4 or more. The value of $\{(Gs-Gt)/2\}/Lt$ is desirably 2.5 or less and more desirably 2.0 or less.

As shown in FIG. 2, the protruding portion 13 includes a plurality of leg portions 13a. The plurality of leg portions 13a are disposed around the central axis of the protruding portion 13 and spaced from each other by a slit 13s extending from the end of the protruding portion 13 along the central axis of the protruding portion 13. At least one of the plurality of leg portions 13a includes an engaging portion 13k capable of being engaged with the housing 2. The engaging portion 13k protrudes outward in a direction perpendicular to the central axis of the protruding portion 13. According to this configuration, in a procedure, including insertion of the protruding portion 13 into the opening 21, for attaching the ventilation component 1 to the housing 2, the leg portion 13a elastically deforms inward when an end portion of the protruding portion 13 comes into contact with the edge 2f. Then, the deformed leg portion 13a returns to its original form when the engaging portion 13k passes through the opening 21, and the engaging portion 13k, for example, comes into contact with an inner surface of the housing 2. In this manner, the engaging portion 13k is engaged with the housing 2 by snap-fitting and the ventilation component 1 is attached to the edge 2f of the housing 2.

Figure 3B:
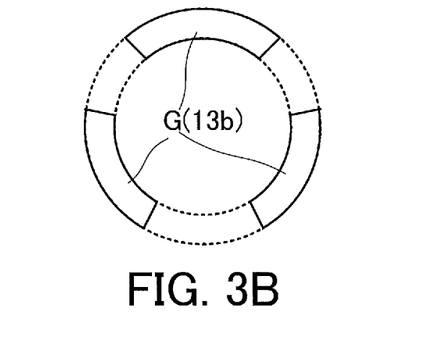
FIG. 3B shows a ring-shaped figure defined by a bottom face of a protruding portion of the ventilation component shown in FIG. 1.

As shown in FIG. 3A, the protruding portion 13 includes, for example, a flat or curved bottom face 13b at the end portion of the protruding portion 13. As shown in FIG. 3B, a ring-shaped figure G is defined by the bottom face 13b when the bottom face 13b is viewed in plan. The figure G may be, for example, an annular figure or a plurality of curved-belt-shaped figures disposed along an annular ring at given intervals. In the ventilation component 1, a ratio Gs/Gr is, for example, 2.5 or more and 5.0 or less. Gr is a maximum outer diameter of the ring-shaped figure G. According to this configuration, when the protruding portion 13 is inserted into the opening 21 with the ventilation component 1 at a slant angle to the axis A1, outward deformation of the protruding portion 13 is more reliably reduced and breakage of the ventilation component 1 is easily prevented.

Figure 3C:
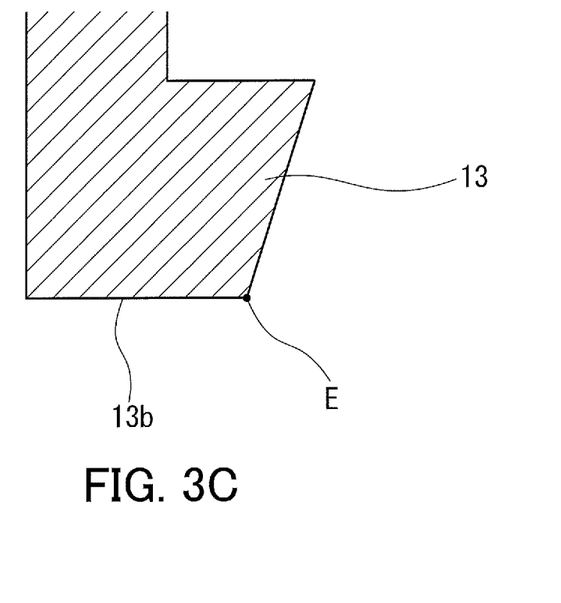
FIG. 3C is a cross-sectional view showing one example of the bottom face of the protruding portion of the ventilation component shown in FIG. 1.
Figure 3D:
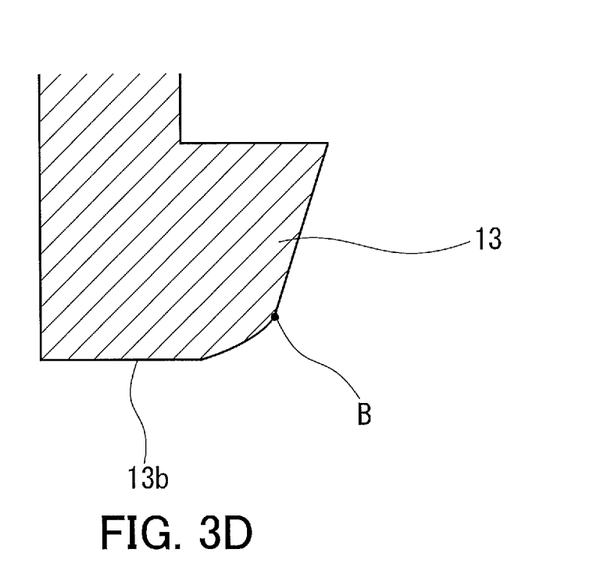
FIG. 3D is a cross-sectional view showing another example of the bottom face of the protruding portion of the ventilation component shown in FIG. 1.

As shown in FIG. 3C, when a part of the bottom face 13b corresponding to an outermost part of the figure G is formed of a flat face, the maximum outer diameter of the figure G is defined by an outer edge E of the flat face. As shown in FIG. 3D, when the part of the bottom face 13b corresponding to the outermost part of the figure G is formed of a curved face, in a cross-section along a plane including the central axis of the protruding portion 13, the maximum outer diameter of the figure G is defined by a boundary B between the curved face and an outline that is positioned outside of the curved face and whose curvature can be considered 0.

The ratio Gs/Gr is desirably 2.6 or more and more desirably 2.8 or more. The ratio Gs/Gr is desirably 4.5 or less and more desirably 4.0 or less.

The supporting portion 12 and the protruding portion 13 may be an integrally-molded component or may be components separately produced. The materials of the supporting portion 12 and the protruding portion 13 are, for example, a thermoplastic resin in view of moldability. Examples of the thermoplastic resin can include polyamides (PA), polyethylene terephthalate (PET), polyphenylene sulfide (PPS), polybutylene terephthalate (PBT), polycarbonate (PC), polypropylene (PP), polyphenylene ether (PPE), and thermoplastic elastomers. The materials of the supporting portion 12 and the protruding portion 13 may be a thermosetting resin or a metal. The materials of the supporting portion 12 and the protruding portion 13 may be a rubber. Examples of the rubber include nitrile-butadiene rubber (NBR), ethylene propylene rubber (EPDM), silicone rubbers, fluorine rubbers, acrylic rubbers, and hydrogenated nitrile rubbers.

As shown in FIG. 2, the supporting portion 12 typically includes an adherend surface 12b to which the gas-permeable membrane 11 is attached. The adherend surface 12b is, for example, a ring-shaped surface. The gas-permeable membrane 11 is disposed, for example, along the direction perpendicular to the central axis of the protruding portion 13.

In the ventilation component 1, a ratio Nt/Gt is, for example, 2.0 or more and 8.0 or less. As shown in FIG. 3A, Nt is a maximum inner diameter of the ventilation path 10, the maximum inner diameter being defined at a position in contact with a surface of the gas-permeable membrane 11, the surface being configured to face the inner space 2u when the ventilation component 1 is attached to the edge 2f.

According to this configuration, the maximum inner diameter Nt of the ventilation path 10 is likely to be large. That is advantageous in view of increasing the amount of gas permeating through the ventilation component 1.

The ratio Nt/Gt is desirably 2.5 or more and more desirably 3.0 or more. The ratio Nt/Gt is desirably 7.0 or less and more desirably 6.0 or less.

The gas-permeable membrane 11 is not limited to a particular gas-permeable membrane as long as the gas-permeable membrane 11 has desirable gas permeability. The gas-permeable membrane 11 may be a single layer membrane, or may be a multilayer membrane. In the case where the gas-permeable membrane 11 is a multilayer membrane, each layer thereof can be one selected from the group consisting of a porous membrane, a nonwoven fabric, a cloth, and a mesh. The gas-permeable membrane 11 may include: a porous membrane and a nonwoven fabric; a porous membrane and at least one of a cloth and a mesh; or a plurality of nonwoven fabrics. Typically, the gas-permeable membrane 11 is composed of an organic polymer material (resin). The material of the porous membrane is, for example, a fluorine resin. As the fluorine resin can be used, for example, polytetrafluoroethylene (PTFE), polychlorotrifluoroethylene, a tetrafluoroethylene-hexafluoropropylene copolymer, or a tetrafluoroethylene-ethylene copolymer. The material of the porous membrane may be a polyolefin, such as a homopolymer or copolymer of a monomer(s) such as ethylene, propylene, or 4-methylpentene-1,1-butene. The porous membrane may be a porous nanofiber membrane made of, for example, polyacrylonitrile, nylon, or polylactic acid. The porous membrane can be manufactured by a known drawing or extraction technique. Examples of the materials of the nonwoven fabric, the cloth, and the mesh include polyesters such as polyethylene terephthalate, polyolefins such as polyethylene and polypropylene, nylon, aramids, and ethylene-vinyl acetate copolymer.

The gas-permeable membrane 11 desirably includes a PTFE porous membrane. The PTFE porous membrane can ensure gas permeability with a small area and can effectively prevent entry of foreign matters. The PTFE porous membrane may be layered on a gas-permeable supporting member such as a nonwoven fabric.

The gas-permeable membrane 11 may be subject to a liquid-repellant treatment as necessary. The liquid-repellant treatment is performed, for example, by forming a liquid-repellant coating film containing a fluorine surface modifier having a perfluoroalkyl group on the gas-permeable membrane 11. The method for forming the liquid-repellant coating film is not limited to a particular formation method. The liquid-repellant coating film is formed, for example, by coating a porous resin membrane with a solution or dispersion of a fluorine surface modifier having a perfluoroalkyl group by a method such as air spraying, electrostatic spraying, dip coating, spin coating, roll coating, curtain flow coating, or impregnation. The liquid-repellant coating film may be formed by electrodeposition or plasma polymerization.

The gas-permeable membrane 11 is, for example, adhered to the adherend surface 12b. The gas-permeable membrane 11 may be welded to the adherend surface 12b. The available welding method can be thermal welding, ultrasonic welding, and laser welding. Alternately, at the time of molding the supporting portion 12, the gas-permeable membrane 11 may be attached to the adherend surface 12b by insert molding, specifically, by pouring a resin in a mold for molding the supporting portion 12 with the gas-permeable membrane 11 disposed at a given position in the mold. The gas-permeable membrane 11 may be attached to the adherend surface 12b with a double-sided adhesive tape.

The sealing member 14 is not limited to a particular sealing member as long as the sealing member 14 has desirable sealability. In a state where the ventilation component 1 is not attached to the housing 2, a cross-section of the sealing member 14 cut along a plane including an axis of the sealing member 14 is, for example, a circular plane, an elliptical plane, or a plane having a corner. The plane having a corner may be a polygon or a figure composed of a combination of a curved line and a straight line. The sealing member 14 may have a hollow structure having a ring-shaped inner space.

The material of the sealing member 14 is not limited to a particular material as long as the sealing member 14 can exhibit desirable sealability. For example, any of the materials described above as examples of the materials of the supporting portion 12 and the protruding portion 13 can be used as the material of the sealing member 14. The sealing member 14 is typically an elastic body that is elastically deformable, and the material of the sealing member 14 can be an elastomer such as a natural rubber, a synthetic rubber, or a thermoplastic elastomer.

As shown in FIG. 2, the ventilation component 1 further includes, for example, a cover 16. The cover 16 is coupled to the supporting portion 12. The cover 16 covers the gas-permeable membrane 11 and forms, between the gas-permeable membrane 11 and the cover 16, a space 17s communicating with an outer space of the ventilation component 1. The space 17s forms part of the ventilation path 10. Owing to the cover 16, the gas-permeable membrane 11 is protected appropriately.

The cover 16 may be a component integrally molded with the supporting portion 12 or may be a component produced separately from the supporting portion 12. Any of the materials described as examples of the material of the supporting portion 12 can be used, for example, as the material of the cover 16.

At least either of the supporting portion 12 and the cover 16 may have a side wall disposed at an outer perimeter of the space 17s. The side wall can include a plurality of side walls separately disposed in a perimeter direction of the space 17s at given intervals. The supporting portion 12 and the cover 16 each may have a plurality of side walls separately disposed in the perimeter direction at given intervals. In that case, the side walls of the supporting portion 12 and the side walls of the cover 16 may partially overlap in the perimeter direction.

As shown in FIG. 2, a ventilation structure 50 can be provided by attaching the ventilation component 1 to the edge 2f of the opening 21 of the housing 2. In the ventilation structure 50, the housing 2 is, for example, a housing of an electronic device. Examples of the electronic device include automotive electronic devices, such as vehicle lamps, electronic control units (ECUs), electric power systems (EPSs), battery packs, inverters, converters, millimeter-wave radars, and vehicle-mounted cameras. The electronic device may be one used in applications other than use for automobiles. In the ventilation structure 50, the ventilation path 10 can eliminate a pressure difference occurring between the internal space 2u and the outer space 2s of the housing 2 due to a temperature variation. Moreover, since the gas-permeable membrane 11 closes the ventilation path 10 in a ventilatable manner, entry of foreign matters into the internal space 2u can be prevented and, for example, the ventilation structure 50 has dust proofness. Furthermore, the ventilation structure 50 can prevent entry of water, oil, salt, etc. into the internal space 2u.

The invention claimed is:

1. A ventilation component configured to be attached to an edge of an opening of a housing, the opening communicating an inner space and an outer space of the housing, the ventilation component comprising:
   a ventilation path for allowing ventilation between the inner space and the outer space when the ventilation component is attached to the edge;
   a supporting portion surrounding the ventilation path;
   a gas-permeable membrane bonded to the supporting portion and closing the ventilation path in a ventilatable manner;
   a protruding portion having a tubular shape, the protruding portion being arranged to protrude from the supporting portion and surround one end of the ventilation path, the protruding portion being configured to be in contact with the edge when the ventilation component is attached to the edge; and
   a sealing member disposed around the protruding portion, the sealing member configured to seal a gap between an outer surface of the housing and the ventilation component when the ventilation component is attached to the edge, wherein
   the ventilation component satisfies requirements $2.5 \leq Gs/Gt \leq 5.0$ and $1.0 \leq \{(Gs-Gt)/2\}/Lt \leq 3.0$, where Gt is a maximum outer diameter of the protruding portion in a boundary between the protruding portion and the supporting portion, Gs is a maximum outer diameter of an outer surface of the supporting portion in contact with the protruding portion and is defined when the outer surface of the supporting portion is viewed in plan, and Lt is a maximum length of the protruding portion in a direction parallel to a central axis of the protruding portion.

2. The ventilation component according to claim 1, wherein
   the protruding portion includes a plurality of leg portions disposed around the central axis and spaced from each other by a slit extending from an end of the protruding portion along the central axis, and
   at least one of the plurality of leg portions protrudes outward in a direction perpendicular to the central axis and includes an engaging portion capable of being engaged with the housing.

3. The ventilation component according to claim 1, wherein
   the protruding portion includes a flat or curved bottom face at an end portion of the protruding portion, and
   a ratio of the maximum outer diameter of the outer surface of the supporting portion to a maximum outer diameter of a ring-shaped figure defined by the bottom face when the bottom face is viewed in plan is 2.5 or more and 5.0 or less.

4. The ventilation component according to claim 1, wherein a ratio of a maximum inner diameter of the ventilation path to the maximum outer diameter of the protruding portion in the boundary is 2.0 or more and 8.0 or less, the maximum inner diameter being defined at a position in contact with a surface of the gas-permeable membrane, the surface being configured to face the inner space when the ventilation component is attached to the edge.

* * * * *